(12) United States Patent
Seok

(10) Patent No.: US 9,837,529 B1
(45) Date of Patent: Dec. 5, 2017

(54) POWER MOSFET HAVING IMPROVED MANUFACTURABILITY, LOW ON-RESISTANCE AND HIGH BREAKDOWN VOLTAGE

(71) Applicant: IXYS Corporation, Milpitas, CA (US)

(72) Inventor: Kyoung Wook Seok, Milpitas, CA (US)

(73) Assignee: IXYS Corporation, Milpitas, CA (US)

( * ) Notice: Subject to any disclaimer, the term of this patent is extended or adjusted under 35 U.S.C. 154(b) by 0 days.

(21) Appl. No.: 15/284,488

(22) Filed: Oct. 3, 2016

(51) Int. Cl.
| | |
|---|---|
| H01L 29/78 | (2006.01) |
| H01L 29/10 | (2006.01) |
| H01L 29/06 | (2006.01) |
| H01L 29/08 | (2006.01) |
| H01L 23/535 | (2006.01) |
| H01L 29/417 | (2006.01) |

(52) U.S. Cl.
CPC ........ *H01L 29/7811* (2013.01); *H01L 23/535* (2013.01); *H01L 29/0623* (2013.01); *H01L 29/0634* (2013.01); *H01L 29/0692* (2013.01); *H01L 29/0856* (2013.01); *H01L 29/1079* (2013.01); *H01L 29/1095* (2013.01); *H01L 29/41741* (2013.01); *H01L 29/7813* (2013.01)

(58) Field of Classification Search
CPC ............. H01L 29/7811; H01L 29/7813; H01L 29/0623; H01L 29/1095; H01L 29/41741; H01L 29/0856; H01L 29/0634; H01L 29/0692; H01L 29/1079
See application file for complete search history.

(56) References Cited

U.S. PATENT DOCUMENTS

| | | | |
|---|---|---|---|
| 2008/0099837 A1 | 5/2008 | Akiyama et al. | ............. 257/341 |
| 2016/0141408 A1 | 5/2016 | Seok | |

*Primary Examiner* — Laura Menz
*Assistant Examiner* — Candice Y Chan
(74) *Attorney, Agent, or Firm* — Imperium Patent Works; T. Lester Wallace

(57) ABSTRACT

Stripe-shaped surface transistor structures of a power MOSFET are disposed over an array of parallel-extending P type Buried Stripe-Shaped Charge Compensation Regions (BSSCCRs). The power MOSFET has two and only two epitaxial semiconductor layers, and the BSSCCRs are disposed at the interface between these layers. Looping around the area occupied by these parallel-extending BSSCCRs is a P type ring-shaped BSSCCR. At the upper semiconductor surface are disposed three P type surface rings. The inner surface ring and outer surface ring are coupled together by a bridging metal member, but the center surface ring is floating. The bridging metal member is disposed at least in part over the ring-shaped BSSCCR. The MOSFET has a high breakdown voltage, a low $R_{DS(ON)}$, and is acceptable and suitable for manufacture at semiconductor fabrication plants that cannot or typically do not make superjunction MOSFETs.

20 Claims, 7 Drawing Sheets

CROSS-SECTIONAL VIEW TAKEN ALONG SECTIONAL LINE A-A'

MULTIPLE EPI GROW AND IMPLANT
TYPE OF SUPERJUNCTION MOSFET

DEEP TRENCH AND FILL
TYPE OF SUPERJUNCTION MOSFET

TOP-DOWN VIEW
(BURIED CHARGE COMPENSATION REGIONS)

CROSS-SECTIONAL VIEW TAKEN ALONG SECTIONAL LINE A-A'

CROSS-SECTIONAL VIEW TAKEN ALONG SECTIONAL LINE B-B'

CROSS-SECTION OF A TRENCH-TYPE
TRANSISTOR STRUCTURE FORMED INTO THE UPPER
SURFACE OF THE SECOND EPITAXIAL LAYER

MOSFET UNDER HIGH VDS VOLTAGE CONDITION
($V_{DS}$ = +110V)

POWER MOSFET HAVING IMPROVED MANUFACTURABILITY, LOW ON-RESISTANCE AND HIGH BREAKDOWN VOLTAGE

TECHNICAL FIELD

The described embodiments relate to power field effect transistor devices.

BACKGROUND INFORMATION

For the same breakdown voltage ($BV_{DSS}$) rating and the same die size, the drain-to-source on-resistance ($R_{DS(ON)}$) of a so-called "superjunction" field effect transistor (also called a "superjunction MOSFET") will generally be lower than the $R_{DS(ON)}$ of a conventional non-superjunction MOSFET device. For this reason, superjunction MOSFETs are taking a larger and larger share of the overall MOSFET market as compared to the share attributed to conventional trench-type and planar-type MOSFETs.

FIG. 1 (Prior Art) is a simplified cross-sectional diagram of one type of superjunction MOSFET 101. The vertically oriented charge-balancing pillar structures 102 and 103 of P type semiconductor material are formed by depositing an N− type epitaxial semiconductor layer EPI#1 on an N+ type wafer substrate 104. Regions of P type dopants are implanted into the top surface of EPI#1. These regions are represented by the two co-linear dashed horizontal lines at the top of the EPI#1 layer in the illustration. Then another layer of N− type epitaxial semiconductor material EPI#2 is formed over the first layer. Then another set of regions of P type dopants is implanted into the top surface of EPI#2. Then another layer of N− type epitaxial semiconductor material is formed over the second layer, and yet another set of regions of P type dopants is implanted. After many such epitaxial deposition and implant steps, the P type dopants are made to diffuse so that the vertically oriented P type charge balancing columns 102 and 103 are formed. Surface transistor structures are formed at the top of the overall structure to form the finished superjunction MOSFET device 101.

FIG. 2 (Prior Art) is a simplified cross-sectional diagram of another type of superjunction MOSFET 105. In the manufacture of this device, a thicker epitaxial semiconductor layer 106 is formed on an N+ type wafer substrate 107. Deep trenches 108 and 109 are formed down into epitaxial layer 106. The deep trenches are filled with P type silicon and the upper surface of the overall structure is planarized. Surface transistor structures are then formed at the top of the overall structure resulting in the superjunction MOSFET structure 105 illustrated in FIG. 2. The cost of making such superjunction MOSFETs is generally higher than the cost of making a conventional MOSFET device of the same die size, but for a given $R_{DS(ON)}$ requirement a smaller superjunction MOSFET die can be used. The size of the superjunction MOSFET is so much smaller that the superjunction MOSFET is generally considered more cost effective to manufacture and sell as compared to a conventional MOSFET. Superjunction MOSFETs are cost effective to manufacture and work well in their intended environments as confirmed by the growing market share attributable to superjunction MOSFETs.

SUMMARY

As compared to current state-of-the-art non-superjunction power field effect transistors (so-called power MOSFETS), a novel power field effect transistor device has a reduced drain-to-source on resistance $R_{DS(ON)}$ of about one third of its current value (for a conventional power field effect transistor of a given active area), and this is accomplished for the same target breakdown voltage ($BV_{DSS}$) rating of the device, and without requiring either a deep trench etching manufacturing step or the deposition of more than two epitaxial silicon layers. The novel power field effect transistor device has a typical specific on-resistance ($R_{CN,SP}$) of not more than 0.8 milliohms-cm² when the transistor device is on. For a power field effect transistor device having an active area of 0.20 cm², this translates into an on-resistance $R_{DS(ON)}$ of about four milliohms. The drain-to-source $V_{DS}$ voltage at which the device first suffers breakdown is about 110 volts. If a ten percent margin on breakdown voltage is required for a marketable power field effect transistor device, then the novel field effect transistor device has a 100 volt breakdown voltage rating.

Despite conventional wisdom and common practice in the industry, it is recognized by the inventor that many semiconductor manufacturing facilities (so-called semiconductor "fabs") cannot and/or will not manufacture power transistor devices of the types set forth in FIGS. 1 and 2. Equipment and expertise to perform the deep trench etching required to the make the device of FIG. 2 is lacking in some such semiconductor fabs. In high volume semiconductor fabs that typically make digital logic devices in high volume, the manufacturing of the type of superjunction MOSFET of FIG. 1 is typically not possible because these fabs do not typically have equipment to grow the epitaxial silicon layers. In the manufacture of power transistor devices having such an epitaxial layer, the substrate wafer with the first epitaxial layer on it is manufactured at another facility and is then supplied into the high volume fab where the remaining fine geometry semiconductor fabrication processing is performed. The first facility that carries out the epitaxial deposition is a fab that has much less expensive equipment, whereas the second facility that carries out the implanting has the expensive equipment required to do the implanting. The importing of items into the high volume and expensive facility is a source of impurities and contamination that can disrupt other operations of the facility. The operators of such facilities may, therefore, decline to manufacture power devices of the type of FIG. 1 in relatively low volumes because doing so would involve importing unfinished wafers into the plant over and over as each successive one of the epitaxial layers that was deposited outside the fab is brought back into the fab so that the next implanting step can be done. Accordingly, due to the limitations on where devices involving many epitaxial layers can be made, fabrication costs associated with the superjunction MOSFET of FIG. 1 can be undesirably high.

In accordance with one novel aspect, it is recognized that such a high volume manufacturer will accept the importing into its plant of an in-process wafer two times, the first time being when the substrate wafer has a first epitaxial layer deposited on it, and the second being when the substrate wafer has a second epitaxial layer deposited on the first epitaxial layer. Buried charge compensation layers of the novel power field effect transistor device do not extend up to the surface of the second epitaxial layer so the device does not have the familiar P type "column" or "pillar" structures of the superjunction MOSFETs of FIG. 1 and FIG. 2. The buried charge compensation layers are disposed with respect to one another at the interface between the first and second epitaxial semiconductor layers in such a way that there are slight local variations in the charge compensation and charge balance between the buried P type charge compensation regions and the surrounding N– type epitaxial semiconductor material. These local variations are present at the ends of a set of parallel-extending and straight-line Buried Stripe-Shaped Charge Compensation Regions (BSSCCRs) where a surrounding P type inner BSSCCR ring rings around the set of parallel-extending P type BSSCCRs.

In accordance with a novel aspect, the high breakdown voltage rating of the device is achieved by recognizing that breakdown occurs first here at the ends of the parallel-extending BSSCCRs, and then providing a floating P type surface ring structure directly above the buried inner P type BSSCCR ring. In addition, there is a P type surface ring located just inside the floating P type surface ring, and there is another P type surface ring located just outside the floating P type surface ring. The three P type surface rings are concentric. The inner and outer P type surface rings are electrically connected together by a metal bridging member. The metal bridging member bridges up and over the floating P type surface ring. Due to the fact that the floating P type surface ring is floating, in a high $V_{DS}$ condition the strength of the electric field in the vicinity of the buried inner BSSCCR (at the ends of the parallel-extending BSSCCRs) is reduced as compared the strength of the electric field immediately inside the inner BSSCCR ring and immediately outside the inner BSSCCR ring. As a result, the novel power field effect transistor device has the breakdown voltage rating of 100 volts despite the fact that the P type charge compensation regions do not extend up to the semiconductor surface of the device. Due to the device having two and only two epitaxial layers, the implanting and fine geometry processing involved in making the device can be done at semiconductor wafer fabrication plants that cannot make superjunction MOSFETs of the type set forth in FIG. 1 and FIG. 2.

In one novel aspect, a power field effect transistor die structure comprises a substrate semiconductor layer, a first epitaxial semiconductor layer, a second epitaxial semiconductor layer, a plurality of parallel-extending BSSCCRs, a surface transistor structure, an inner BSSCCR, and outer BSSCCR, a first surface region, a second surface region, a third surface region, and a bridging metal member. The substrate semiconductor layer is of a first conductivity type. The first epitaxial semiconductor layer is disposed on the substrate semiconductor layer and is of the first conductivity type. The second epitaxial semiconductor layer is disposed on the first epitaxial semiconductor layer and is of the first conductivity type. The second epitaxial semiconductor layer has an upper semiconductor surface that is also the upper semiconductor surface of the die structure. The first and second epitaxial semiconductor layers are the only epitaxial semiconductor layers of the power field effect transistor die structure.

Each BSSCCR of the plurality of parallel-extending BSSCCRs is a straight, stripe-shaped, region of a second conductivity type. Each of the parallel-extending BSSCCRs is disposed partly in the first epitaxial layer and is disposed partly in the second epitaxial layer but is entirely covered by semiconductor material of the first conductivity type of the second epitaxial semiconductor layer. Each of the parallel-extending BSSCCRs has an end. One of the parallel-extending BSSCCRs extends in a first straight line from a first end to a second end.

The surface transistor structure is disposed over the plurality of parallel-extending BSSCCRs, and has a gate region and a source region. In one example the surface transistor structure is an array of trench-type transistor devices, and in another example the surface transistor structure is an array of planar-type transistor devices.

The inner BSSCCR is of the second conductivity type. The inner BSSCCR extends for a distance in a second straight line. The second straight line is perpendicular to the first straight line. The inner BSSCCR is disposed partly in the first epitaxial layer and is disposed partly in the second epitaxial layer but is entirely covered by semiconductor material of the first conductivity type of the second epitaxial semiconductor layer.

The outer BSSCCR is of the second conductivity type. The outer BSSCCR extends parallel to the inner BSSCCR such that the inner BSSCCR is disposed between the outer BSSCCR and the plurality of parallel-extending BSSCCRs. The outer BSSCCR is disposed partly in the first epitaxial layer and is disposed partly in the second epitaxial layer but is entirely covered by semiconductor material of the first conductivity type of the second epitaxial semiconductor layer. In one example, the inner and outer buried BSSCCRs are a pair of buried P type concentric ring-shaped regions. For stretches, each of these buried P type concentric ring-shaped regions extends in a straight line. All BSSCCRs of the device are floating, including all the BSSCCRs of the plurality of parallel-extending BSSCCRs, and including the inner BSSCCR, and including the outer BSSCCR.

The first surface region is of the second conductivity type. The first surface region is disposed at the upper semiconductor surface of die structure.

The second surface region is of the second conductivity type. The second surface region extends parallel to the first surface region at the upper semiconductor surface of the die structure. The second surface region is floating and is stripe-shaped.

The third surface region is of the second conductivity type. The third surface region extends parallel to the second surface region at the upper semiconductor surface of the die structure such that the second surface region is disposed between the first and third surface regions. The third surface region is stripe-shaped. In one example, the first, second and third surface regions are three concentric surface rings of P type material disposed in N– type material of the second epitaxial semiconductor layer, where the second ring-shaped P type surface region is disposed directly over the ring-shaped P type inner BSSCCR.

The metal bridging member electrically couples the first and third surface regions together, but is not physically contacting the second surface region. In one example the metal bridging member contacts the first surface region at the upper semiconductor surface, and bridges up and over the second surface region, and contacts the third surface region at the upper semiconductor surface. The metal bridging member is disposed at least in part over the inner BSSCCR.

Each BSSCCR (whether it be a BSSCCR of the plurality of parallel-extending BSSCCRs, or the inner BSSCCR, or the outer BSSCCR) has a cross-sectional width and a cross-sectional height. The cross-sectional height is greater than the cross-sectional width. This cross-sectional shape of the BSSCCRs, and the spacing between adjacent BSSCCRs, reduces current crowding in the on-state of the device and therefore reduces the $R_{DS(ON)}$ of the device. In one example this is accomplished by blanket implanting N type dopants (phosphorus) into the top of the first epitaxial layer. This blanket implant can be performed either before or after the masked implant of the P type dopants (boron) that will diffuse to form the BSSCCRs. After the blanket implanting of N type dopants and the masked implanting of the P type dopants for the buried regions, the second epitaxial semiconductor layer is formed on the first epitaxial semiconductor layer. P type dopants are implanted into the upper surface of the second epitaxial layer (to form the P type body regions in the active area and to form the first, second and third surface rings), and then the wafer structure is heat treated to diffuse the dopants. Due to the blanket N type dopant implant and the narrow 0.5 micron wide implant windows used in implanting P type dopants, each resulting BSSCCR has a cross-sectional height that is greater than its cross-sectional width.

Further details and embodiments and techniques are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

DETAILED DESCRIPTION

Reference will now be made in detail to some embodiments of the invention, examples of which are illustrated in the accompanying drawings. In the description and claims below, when a first object is referred to as being disposed "over" or "on" a second object, it is to be understood that the first object can be directly on the second object, or an intervening object may be present between the first and second objects. Similarly, terms such as "upper", "top", "up", "on", "over", "cover", "down", "vertical", "horizontal", "laterally", "lower", "bottom", "underneath", "height" and "width" are used herein to describe relative orientations between different parts of the structure being described, and it is to be understood that the overall structure being described can actually be oriented in any way in three-dimensional space. The notations N+, N, N−, P, and P− are only relative, and are to be considered in context, and do not denote any particular dopant concentration range.

Figures 1, 2:
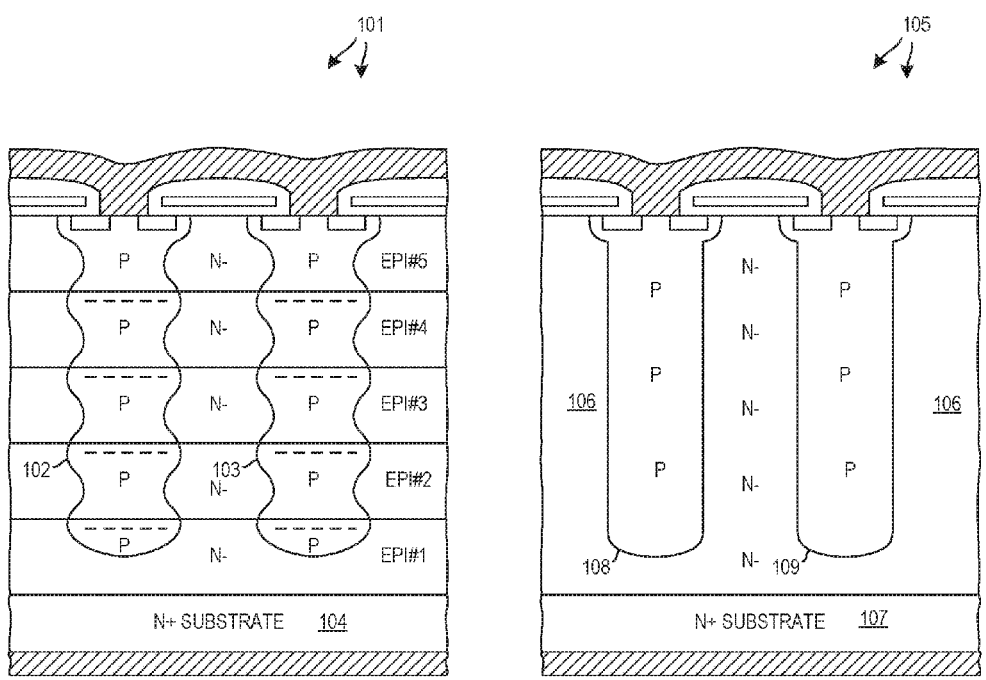
FIG. 1 (Prior Art) is a simplified diagram of a first type of conventional superjunction MOSFET.
FIG. 2 (Prior Art) is a simplified diagram of a second type of conventional superjunction MOSFET.
Figure 3:
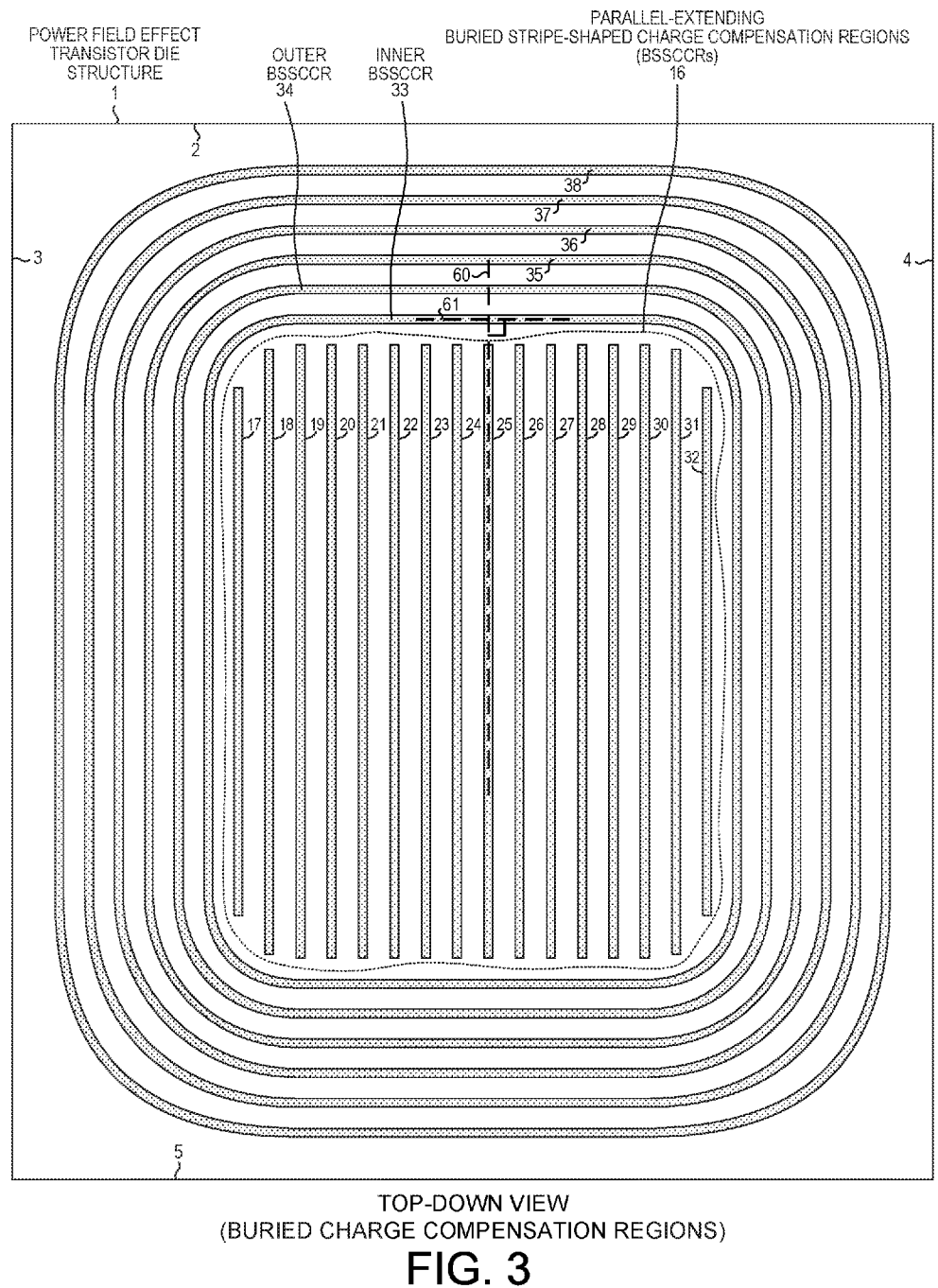
FIG. 3 is a top-down diagram of P− type buried charge compensation regions of a power field effect transistor die structure in accordance with one novel aspect.
Figure 4:
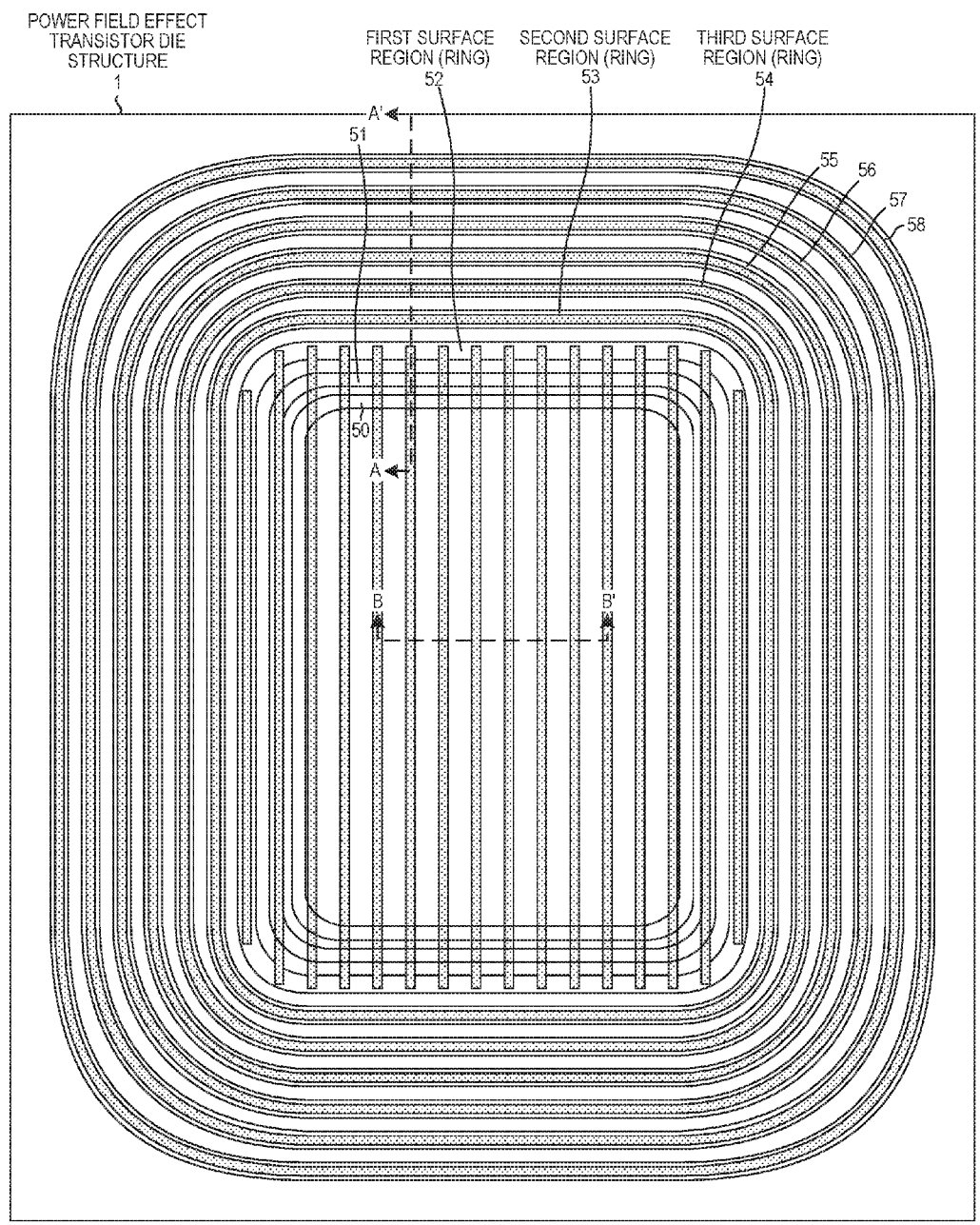
FIG. 4 is a top-down diagram that shows, along with the P− type buried charge compensation regions of FIG. 3, P type surface regions (P type surface rings) of the power field effect transistor die structure.
Figure 5:
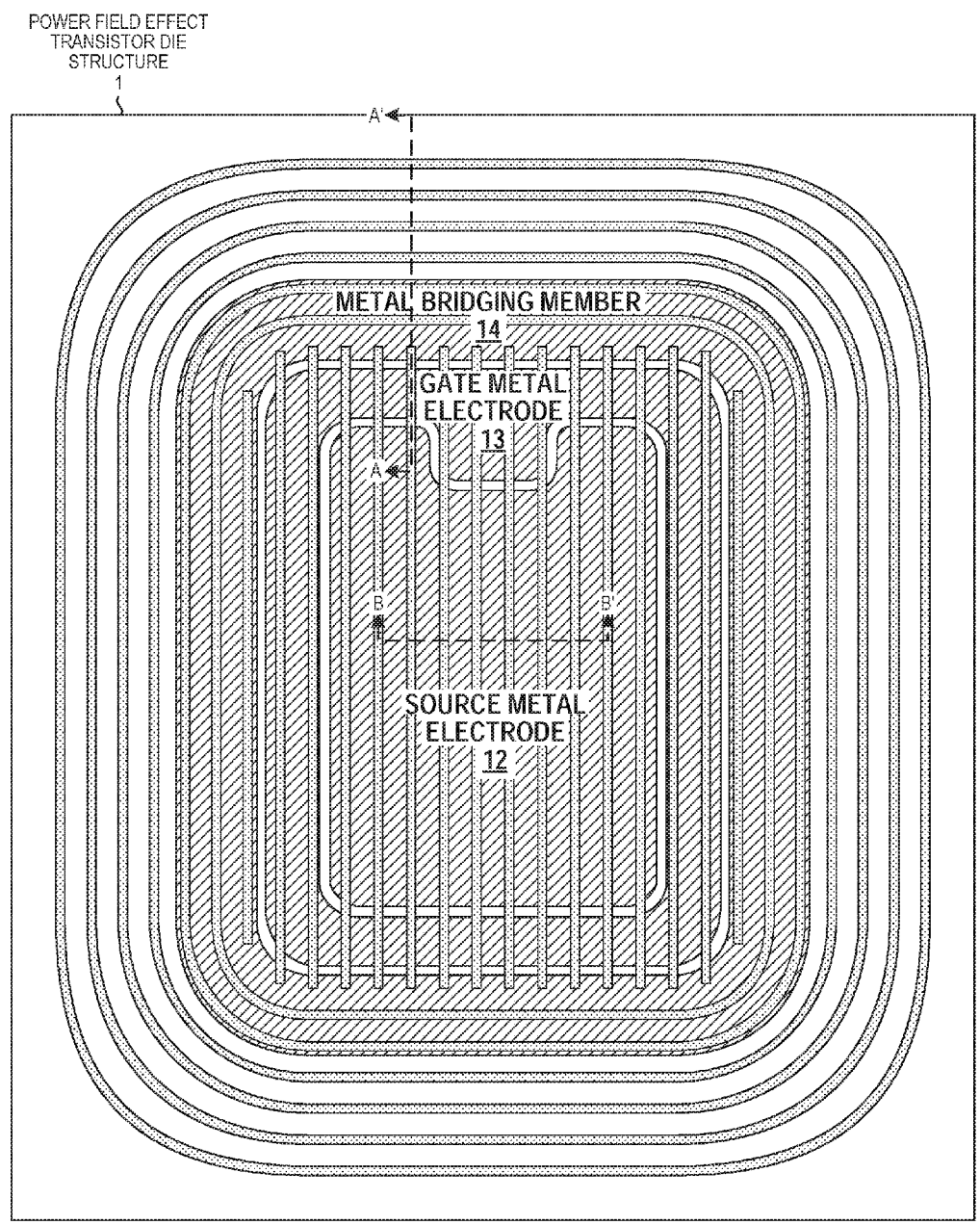
FIG. 5 is a top-down diagram that shows, along with the P− type buried charge compensation regions of FIG. 3, metal structures disposed at the top of the power field effect transistor die structure.
Figure 6:
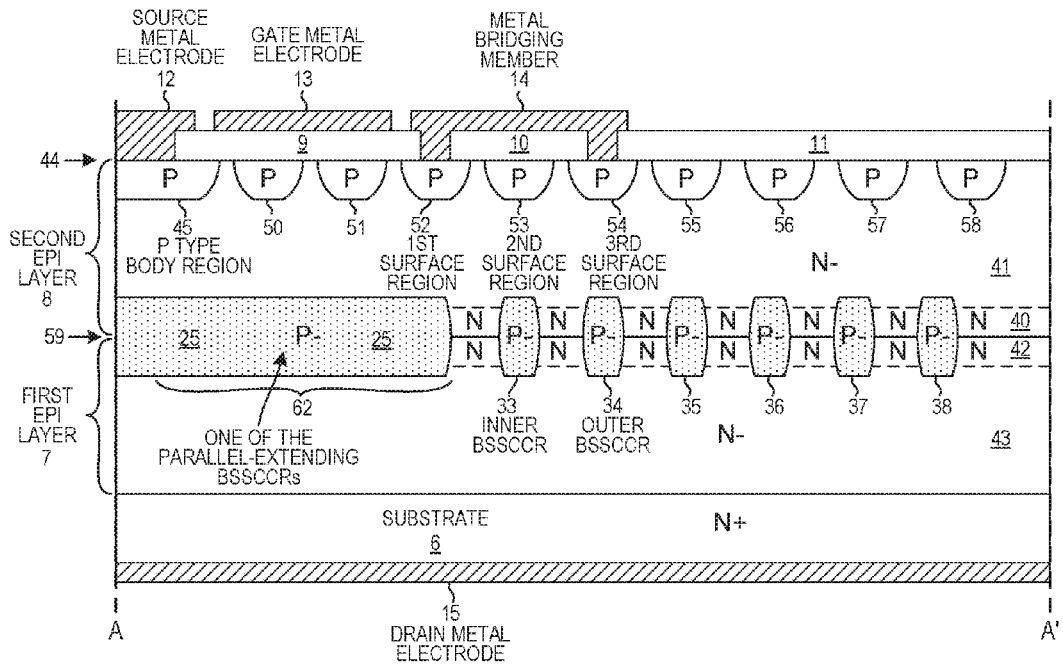
FIG. 6 is a cross-sectional diagram taken along section line A-A' of FIGS. 3 and 4.
Figure 7:
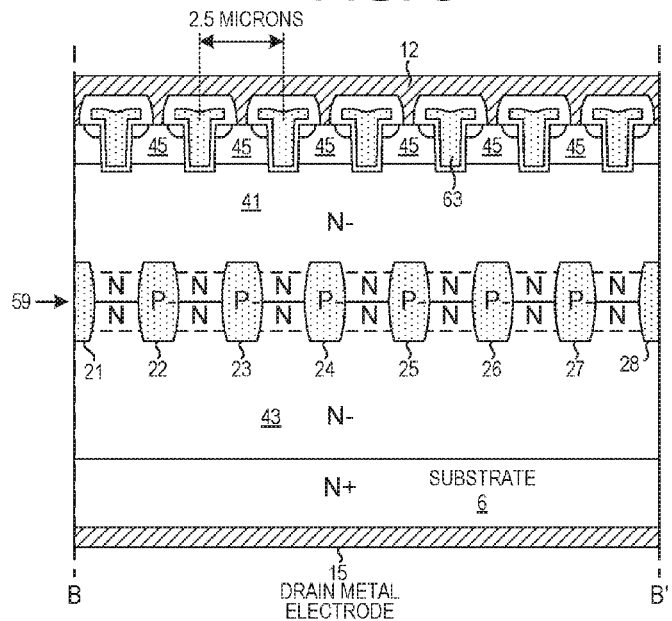
FIG. 7 is a cross-sectional diagram taken along section line B-B' of FIGS. 3 and 4.

FIG. 3 is a top-down diagram of P− type buried charge compensation regions of a power field effect transistor die structure 1 in accordance with one novel aspect. Power field effect transistor die structure 1 is a rectangular die having four side edges 2-5. FIG. 4 is a top-down diagram that shows, along with the P− type buried charge compensation regions, P type surface regions (rings) of the power field effect transistor die structure 1. FIG. 5 is a top-down diagram that shows, along with the P− type buried charge compensation regions, metal structures that are on the top of the power field effect transistor die structure 1. In the illustration, the P− type buried charge compensation regions are shown on top of the metal structures so that their locations with respect to the metal structures can be seen. It is understood, however, that the metal structures are disposed over the P− type buried charge compensation regions. FIG. 6 is a cross-sectional diagram taken along section line A-A' of FIGS. 3 and 4. FIG. 7 is a cross-sectional diagram taken along section line B-B' of FIGS. 3 and 4.

Power field effect transistor die structure 1 includes a substrate layer 6 of N+ type single crystal silicon wafer material, a 3.0 micron thick first epitaxial silicon layer 7 disposed on the substrate layer, a 3.0 micron thick second epitaxial silicon layer 8 disposed on the first epitaxial silicon layer, insulative silicon oxide features 9-11, a source metal electrode 12, a gate metal electrode 13, a metal bridging member 14, and a drain metal electrode 15. The first and second epitaxial silicon layers 7 and 8 are the only epitaxial silicon layers of the die 1. At the interface 59 between the first and second epitaxial layers 7 and 8 are a plurality of P− type Buried Stripe-Shaped Charge Compensation Regions (BSSCCRs). Each of these BSSCCRs extends from the interface 59 up into the bottom of the second epitaxial layer 8 and also extends from the interface 59 down into the top of the first epitaxial layer 7. Each BSSCCR is a stripe in the sense that it is a long and narrow region of the same width throughout its length.

As shown in FIG. 3, the power field effect transistor die structure 1 includes a plurality of parallel-extending P− type BSSCCRs 16. In the particular example of FIG. 3, there are sixteen of these BSSCCRs 17-32. Each of these BSSCCRs extends in a straight line from a first end of the BSSCCR to a second end of the BSSCCR. In the illustration of FIG. 3, the first ends of the parallel-extending BSSCCRs are the upper ends of the stripe-shaped BSSCCRs. The second ends are the lower ends of the parallel-extending BSSCCRs. The first ends of the third through the fourteenth BSSCCR 19-30 are disposed in a straight line. This straight line extends in the horizontal dimension in the diagram of FIG. 3. Likewise, the second ends of the third through the fourteenth BSSCCR are disposed in a straight line that extends in the horizontal dimension in the illustration. The third through the fourteenth BSSCCRs 19-30 are all of the same length.

In addition to the parallel-extending P− type BSSCCRs 17-32, the power field effect transistor die structure 1 also includes six stripe-shaped BSSCCR rings 33-38. As illustrated in FIG. 3, these P− type BSSCCR rings 33-38 are concentric rings that surround the parallel-extending BSCCRRs 16. The innermost ring 33 is also referred to as the "inner BSSCCR". The next ring 34 is also referred to as the "outer BSSCCR". It is "outer" with respect to the inner BSSCCR ring.

One of the third through the fourteenth BSSCCRs (for example, the ninth BSSCCR 25) of the parallel-extending BSSCCRs 17-32 extends in a first straight line 60. This first straight line 60 is vertical in the illustrated orientation of FIG. 3. The inner BSSCCR 33 extends for a distance along a second straight line 61 along the upper ends of the parallel-extending BSSCCRs 16. Second straight line 61 is perpendicular to first straight line 60. In the orientation of FIG. 3, the inner BSSCCR 33 extends in the horizontal dimension at the location where lines 60 and 61 cross. As shown in FIG. 3, the inner BSSCCR 33 has a stripe-shape and extends adjacent a periphery of the area occupied by the parallel-extending BSSCCRs 17-32 so that the inner BSSCCR 33 rings around this periphery.

The outer BSSCCR 34 also has a stripe-shape. It extends parallel to the inner BSSCCR 33 as illustrated. There is no other P type region disposed between the first ends of the parallel-extending P– type BSSCCRs 17-32 and the inner P-type BSSCCR ring 33.

FIG. 6 shows the cross-section of the BSSCCR structures. Each of the BSSCCRs, whether it is a straight BSSCCR of the parallel-extending BSSCCRs 17-32 or whether it is a ring-shaped BSSCCR of the rings 33-38, has the same identical cross-sectional shape and size. Of importance, each BSCCR has a cross-sectional height that is greater than its cross-sectional width. This reduces current crowding during the transistor on state as electrons flow from transistor structures at the top of the die, vertically down through the epitaxial layers toward the drain electrode. Reduced current crowding allows the $R_{DS(ON)}$ of the device to be lower than it otherwise would be. In the illustrated example, the cross-sectional height is approximately 1.5 microns and the cross-sectional width is approximately 1.0 microns. In the central area of parallel-extending BSSCCRs 16, there is 1.5 microns of N type semiconductor material separating each adjacent pair of parallel-extending BSSCCRs. Likewise, there is 1.5 microns of separation between the first ends (the upper ends in the orientation of FIG. 3) of parallel-extending BSSCCRs 17-32 and the inner BSSCCR 33, and between the second ends (the lower ends in the orientation of FIG. 3) of the parallel-extending BSSCCRs 17-32 and the inner BSSCCR 33. In other embodiments, there is about one micron of separation between the first ends (the upper ends in the orientation of FIG. 3) of parallel-extending BSSCCRs 17-32 and the inner BSSCCR 33, and between the second ends (the lower ends in the orientation of FIG. 3) of the parallel-extending BSSCCRs 17-32 and the inner BSSCCR 33.

The BSSCCRs are made to have this cross-sectional shape by performing a blanket implant of phosphorus into the top surface of the first epitaxial layer 7 prior to the formation of the second epitaxial layer 8. This blanket implant is performed with a 330 keV implant energy so that the phosphorus dopants are implanted to a depth of approximately 0.4 microns. The implant dose is $2.0 \times 10^{12}$ ions/cm$^2$. After this blanket implant, boron for the P– type BSSCCRs is implanted using a mask. The boron is implanted into the top of the first epitaxial layer 7. This boron implant is performed with a 120 keV implant energy and a dose of $1.5 \times 10^{13}$ ions/cm$^2$, so that the boron dopants are implanted to a depth of approximately 0.5 microns. The implant mask has narrow 0.5 micron wide strip-shaped implant windows with a cell pitch of 2.5 microns. After implantation, the second epitaxial layer 8 is formed on top of the first epitaxial layer 7 and the combined structure (the substrate, first epitaxial layer, and second epitaxial layer) is annealed and temperature treated by further processing such that the boron and phosphorus dopants diffuse so as to form the BSSCCR structures pictured in FIG. 6. The subsequent high temperature steps that result in diffusion of the boron and phosphorus dopants are: 1) a body anneal at 1000 degrees Celsius for twenty minutes, 2) sacrificial oxidation and gate oxidation steps, and 3) an insulation layer anneal at 900 degrees Celsius for thirty minutes. The phosphorus from the blanket implant forms an N type layer portion 40 that extends upward from the first/second epitaxial layer interface 59 about 0.1 microns. The second epitaxial layer 8 therefore comprises the N type layer portion 40 and an overlying N– type layer portion 41. The phosphorus from the blanket implant also forms an N type layer portion 42 that extends downward from the first/second epitaxial layer interface 59 about 0.7 microns. The first epitaxial layer 7 therefore comprises an N type layer portion 42 and an underlying N– type layer portion 43. Each of the final P– type BSSCCRs is entirely covered by N– type epitaxial semiconductor material of the second epitaxial layer 8. Each of the final P– type BSSCCRs is also separated from the substrate 6 by N– type epitaxial semiconductor material of the first epitaxial layer 7.

In the central active area of the die, disposed over the region of the parallel-extending BSSCCRs 17-32 there is an array of parallel-extending trench-type transistor structures. FIG. 7 shows some of these trench-type transistor structures in cross-section. The orientation of the parallel-extending trench-type transistor structures with respect to the parallel-extending BSSCCRs 17-32 is such that there is one BSSCCR disposed between each adjacent pair of trenches when the die structure is considered from the top down perspective.

Figure 8:
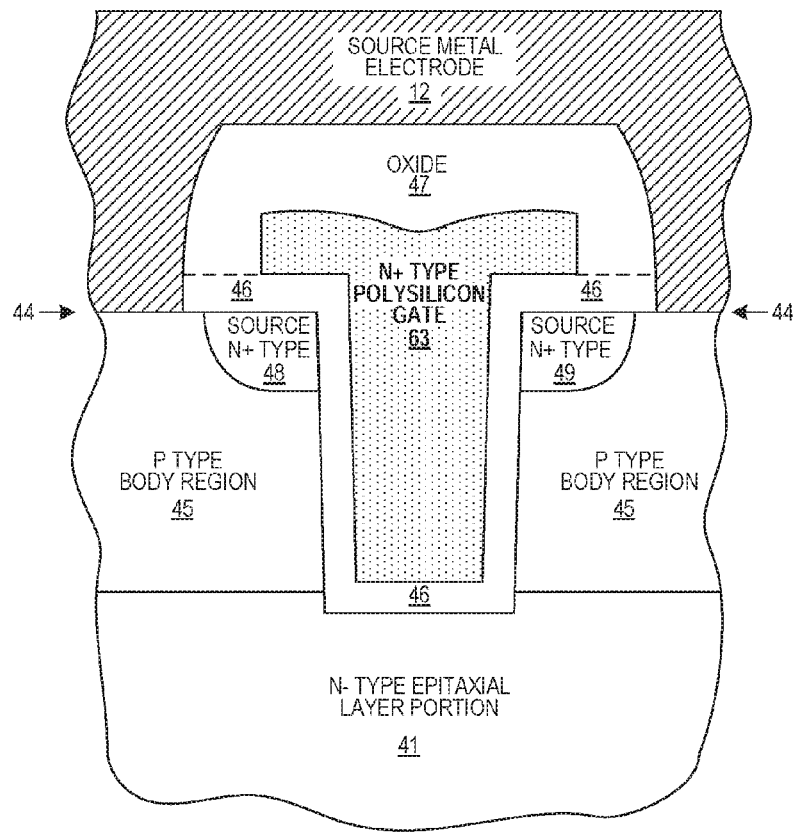
FIG. 8 is a cross-sectional diagram of one of the trench-type transistor structures in the active area of the power field effect transistor die structure.

FIG. 8 is a cross-sectional diagram of one of the trench-type transistor structures. Reference numeral 44 identifies the upper semiconductor surface of the second epitaxial layer 8, which is also the upper semiconductor surface of the overall die structure 1. The upper portion of the second epitaxial layer 8 is doped with P type dopants to form a P type body region 45. A 1.1 micron deep and 0.5 micron wide trench is etched down into the silicon from the upper surface 44. A thin oxide layer 46 is formed on the inside walls of the trench and across surface 44. N+ type polysilicon is blanket deposited on this thin oxide to fill the trench and to cover the thin oxide. This blanket N+ type polysilicon layer not considered to be an epitaxial silicon layer. It is patterned and etched to form the N+ type polysilicon gate structure 63 shown. An additional layer of oxide 47 is formed over the top of the gate. This oxide 47 and the thin oxide 46 are patterned and etched down to the semiconductor surface 44 to form the oxide structures illustrated. There is a 0.5 micron wide stripe of exposed semiconductor material at the semiconductor surface 44 between each adjacent pair of gate structures. Metal is then deposited over the entire structure so that the metal extends down to surface 44 and makes contact with the P type silicon of the P type body region 45. This metal is patterned and etched to form the source metal electrode 12. Reference numerals 48 and 49 identify N+ type source regions. The N+ type source regions between two adjacent parallel-extending trenches, when the structure is considered from the top-down perspective, are actually a single N+ type ladder-shaped region. The parts of the ladder-shaped structure that correspond to ladder siderails extend in parallel with one another, with one siderail extending along one trench and with the other siderail extending along the other trench. The parts of the ladder-shaped structure that correspond to rungs extend at periodic intervals between these siderails. The source metal electrode 12 that extends down to the semiconductor surface 44 between adjacent gates makes contact in this stripe surface region with both the P type body region and with the rung portions of the ladder-shaped N+ type source structure. Contact between the gate metal electrode 13 and the N+ type polysilicon gate 63 is not shown in FIG. 8 because the connection is located outside the cross-sectional plane illustrated.

When the overall transistor structure is turned on and conductive, a voltage on the gate induces conductive channels to form in the P type semiconductor material of the trench sidewalls. Electrons can flow from N type source region 48, downward along one of these conductive channels on the left side of the trench, and downward to the N− type epitaxial layer portion 41, and further downward through the die to the drain metal electrode 15. Likewise, electrons can flow on the other side of the structure from N type source region 49, downward along a conductive channel on the right side of the trench, and downward to the N− type epitaxial layer portion 41, and further downward through the die to the drain metal electrode 15.

Surrounding these trench-type transistor structures is a set of concentric stripe-shaped P type surface regions (rings) 50-58. As shown in FIG. 6, P type surface rings 50 and 51 extend over end portions of the parallel-extending BSSCCRs 17-32. These end portions extend inward until the inner active area part of the die where the transistor structures are located. For example, the end portion 62 at the first end of the BSSCCR 25 is marked in FIG. 6. The P type surface rings 50 and 51 are floating and are not connected to source metal electrode 12, nor to gate metal electrode 13, nor to metal bridging member 14. Neither of these floating P type surface rings 50 or 51 contacts or adjoins either the P type body region 45 or any of the other P type surface rings 52-58. These floating P type surface rings 50 and 51 and the intervening N− type semiconductor material between them provide a weak resistive and capacitive coupling between the P type body region 45 and the first P type surface region (ring) 52. The first P type surface region 52 is also referred to as the first P type surface ring. The ring 53 is also referred to as the second P type surface region or the second P type surface ring. The ring 54 is also referred to as the third P type surface region or the third P type surface ring. As can be seen from FIG. 4, each of these P type surface rings 50-58 has a stripe-shape when considered from the top-down perspective.

First P type surface ring 52 is coupled by the metal bridging member 14 to the third P type surface ring 54. The intervening second P type surface ring 53, however, is floating and is not connected to any other surface ring, nor is it connected to the metal bridging member 14. The first P type surface ring 52 extends over the end portions of the BSSCCRs 17-32 as shown in FIG. 4. As shown in FIGS. 4 and 6, the second P type surface ring 53 is disposed at least in part over the inner BSSCCR 33. As shown in FIGS. 4 and 6, the third P type surface ring 54 is disposed at least in part over the outer BSSCCR 34. In one example, the first P type surface ring is 2.35 microns wide, the second P type surface ring is 2.30 microns wide, and the third P type surface ring is 2.35 microns wide. Each of the three P type surface rings 52-54 is about 0.8 microns deep, which is the same depth as the P type body region 45. There is about 0.2 microns of N− type semiconductor material separating the first and second P type surface rings 52 and 53, and there is also about 0.2 microns of N− type semiconductor material separating the second and third P type surface rings 53 and 54.

Note that the spacing and widths of the surface rings 55-58 is greater than the spacing and widths of the corresponding BSSCCRs 33-38 beneath the surface rings. Accordingly, surface ring 55 is disposed over BSSCCR 33 in a centered fashion, but each successive surface ring extending outward toward the edge of the die is displaced more and more from its corresponding underlying BSSCCR. In the example of FIG. 6, the leftmost edge of surface ring 58 is located above the middle of the underlying BSSCCR 38.

In other embodiments, each successive one of the surface rings 55-58 extending outward toward the edge of the die is narrower that the preceding surface ring. The outer edge of the implant window of each such surface ring has the same location (from the top-down perspective) relative to the outer edge of the implant window for the buried layer implant region below.

Figure 9:
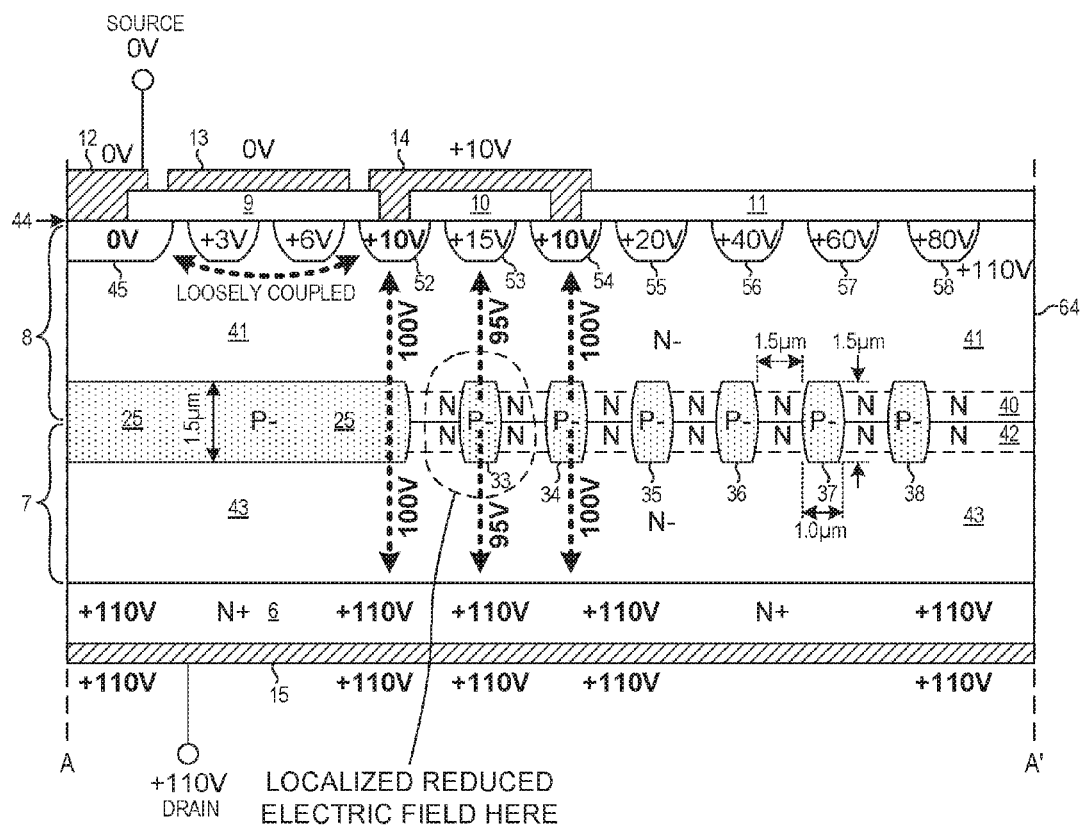
FIG. 9 is a cross-sectional diagram that illustrates operation of the power field effect transistor die structure in a situation in which +110 volts is present between the drain metal electrode and the source metal electrode.

FIG. 9 is a cross-sectional diagram that illustrates operation in a situation of a high 110 volt drain-to-source ($V_{DS}$) voltage. First surface region 52 and third surface region 54 are coupled together by metal bridging member, so the potential on these two regions is the same. The 110 volt difference in potential between the drain metal electrode 15 and the source metal electrode 12 is dropped across the various intervening structures of the device. Extending laterally across the semiconductor surface 44 from left to right in the example of FIG. 9 the potential increases from zero volts on the source metal electrode 12 and P type body region 45 at the left to the +110 volts at the right side edge 64 of the die. The voltage potentials on the rings 50-58 therefore generally increases continuously from ring to ring moving to the right, except for the three rings 52, 53, and 54. Due to rings 52 and 54 being shorted together, the potential on these rings is the same. The 100 volt potential difference between the +10 volts on these rings 52 and 54 and the +100 volt potential on the bottom N+ type substrate 6 is dropped across the various intervening structures of the device. Due to the fact that ring 53 is floating, and is disposed between the two rings 52 and 54, the potential on ring 53 is somewhere between the +10 volt potential on rings 52 and 54 and the +110 volt potential on the underlying N+ type substrate 6. The potential in the example illustrated is +15 volts. Due to this higher potential on the floating ring 53, there is a smaller +95 volt potential difference between the floating ring 53 and substrate 6. The electric field is therefore smaller in the local area near the end of the BSSCCR 25 and the inner BSSCCR 33. Due to the smaller electric field, the device will breakdown first at another location. As a result, the breakdown voltage $BV_DSs$ is increased to +110 volts.

Although certain specific embodiments are described above for instructional purposes, the teachings of this patent document have general applicability and are not limited to the specific embodiments described above. It is to be understood that the structure of FIG. 6 is but one embodiment. In another embodiment, the width of floating second surface ring 53 is larger in order to expand the area of reduced electric field. In some embodiments there is more than one floating ring provided between rings 52 and 54. In some embodiments the bridging metal member 14 is a strip of metal that is disposed at least in part over inner BSSCCR 33, but the floating second surface ring 53 is not actually disposed directly over the inner BSSCCR 33 but rather is located inward of the inner edge of the inner BSSCCR 33. The location of the floating second surface ring 53 laterally with respect to the underlying inner BSSCCR 33 can be shifted either inward or outward (from how it is illustrated in FIG. 9), provided that the metal bridging member 14 is disposed at least in part over the inner BSSCCR 33. Although an example is set forth where the P− type buried charge compensation regions in the active area that underlie the transistors structure are stripe-shaped, these buried charge compensation regions can have other shapes in other embodiments. For example, these P− type buried charge

What is claimed is:

1. A power field effect transistor die structure comprising:
a substrate semiconductor layer of a first conductivity type;
a first epitaxial semiconductor layer disposed on the substrate;
a second epitaxial semiconductor layer disposed on the first epitaxial semiconductor layer, wherein an upper surface of the second epitaxial semiconductor layer is an upper semiconductor surface of the die structure, and wherein the first and second epitaxial semiconductor layers are the only epitaxial semiconductor layers of the power field effect transistor die structure;
a plurality of parallel-extending Buried Stripe-Shaped Charge Compensation Regions (BSSCCRs) of a second conductivity type, wherein each of the parallel-extending BSSCCRs is disposed partly in the first epitaxial layer and is disposed partly in the second epitaxial layer but is entirely covered by semiconductor material of the first conductivity type of the second epitaxial semiconductor layer, wherein each of the parallel-extending BSSCCRs has an end, wherein one of the BSSCCRs extends in a first straight line;
a transistor structure that is disposed over the plurality of parallel-extending BSSCCRs, wherein the transistor structure includes a gate region and a source region;
an inner BSSCCR of the second conductivity type, wherein the inner BSSCCR extends for a distance in a second straight line, wherein the second straight line is perpendicular to the first straight line, wherein the inner BSSCCR is disposed partly in the first epitaxial layer and is disposed partly in the second epitaxial layer but is entirely covered by semiconductor material of the first conductivity type of the second epitaxial semiconductor layer;
an outer BSSCCR of the second conductivity type, wherein the outer BSSCCR extends parallel to the inner BSSCCR such that the inner BSSCCR is disposed between the outer BSSCCR and the plurality of parallel-extending BSSCCRs, wherein the outer BSSCCR is disposed partly in the first epitaxial layer and is disposed partly in the second epitaxial layer but is entirely covered by semiconductor material of the first conductivity type of the second epitaxial semiconductor layer;
a first surface region of the second conductivity type, wherein the first surface region is disposed at the upper semiconductor surface of the die structure;
a second surface region of the second conductivity type, wherein the second surface region extends parallel to the first surface region at the upper semiconductor surface of the die structure, and wherein the second surface region is floating and is stripe-shaped;
a third surface region of the second conductivity type, wherein the third surface region extends parallel to the second surface region at the upper semiconductor surface of the die structure such that the second surface region is disposed between the first and third surface regions, wherein the third surface region is stripe-shaped; and
a metal bridging member that electrically couples the first and third surface regions together, wherein the metal bridging member bridges over the second surface region but is not coupled to the second surface region, and wherein the metal bridging member is disposed at least in part over the inner BSSCCR.

2. The power field effect transistor die structure of claim 1, further comprising:
a drain metal electrode in contact with the substrate semiconductor layer; and
a source metal electrode that contacts a body region of the second conductivity type at the upper semiconductor surface of the die structure, wherein an active area of the power field effect transistor die structure has a specific on-resistance (RON,SP) of not more than 0.8 milliohms-cm2 when the power field effect transistor die structure is on, and wherein the power field effect transistor die structure has a drain-to-source breakdown voltage of at least one hundred volts.

3. The power field effect transistor die structure of claim 1, wherein the second surface region is a ring, and wherein the third surface region is a ring that surrounds the second surface region.

4. The power field effect transistor die structure of claim 1, wherein there is no buried P type semiconductor region disposed between the end of said one of the parallel-extending BSSBCCRs and the inner BSSCCR.

5. The power field effect transistor die structure of claim 1, wherein the power field effect transistor die structure includes no transistor gate region that is disposed outside the first surface region.

6. The power field effect transistor die structure of claim 1, wherein each BSSCCR of the plurality of parallel-extending BSSCCRs has a cross-sectional width and a cross-sectional height, wherein the cross-sectional height is greater than the cross-sectional width.

7. The power field effect transistor die structure of claim 6, wherein the first epitaxial semiconductor layer comprises an N− type layer portion and an N type layer portion, wherein the N− type layer portion of the first epitaxial semiconductor layer is disposed on the substrate semiconductor layer, and wherein the N type layer portion of the first epitaxial semiconductor layer is disposed on the N− type layer portion of the first epitaxial semiconductor layer.

8. The power field effect transistor die structure of claim 7, wherein the second epitaxial semiconductor layer comprises an N− type layer portion and an N type layer portion, wherein the N type layer portion of the second epitaxial semiconductor layer is disposed on the first epitaxial semiconductor layer, and wherein the N− type layer portion of the second epitaxial semiconductor layer is disposed on the N type layer portion of the second epitaxial semiconductor layer.

9. The power field effect transistor die structure of claim 1, wherein the second surface region is disposed at least in part over the inner BSSCCR.

10. The power field effect transistor die structure of claim 1, wherein the transistor structure is taken from the group consisting of: 1) an array of stripe trench transistor devices, and 2) an array of stripe planar transistor devices.

11. The power field effect transistor die structure of claim 1, further comprising:
a source metal electrode that is separate from and does not contact the metal bridging member; and
a gate metal electrode that is separate from and does not contact the metal bridging member.

12. The power field effect transistor die structure of claim 11, wherein said one of the parallel-extending BSSBCCRs has an end portion, and wherein the gate metal electrode extends over the end portion.

13. The power field effect transistor die structure of claim 12, further comprising:
a floating ring disposed underneath the gate metal electrode between the gate metal electrode and the end portion, wherein the floating ring is of the second conductivity type, wherein the floating ring extends at the upper semiconductor surface of the die structure parallel to the first surface region, and wherein the floating ring does not contact the gate metal electrode.

14. The power field effect transistor die structure of claim 13, wherein there is a second floating ring disposed underneath the gate metal electrode between the gate metal electrode and the end portion.

15. The power field effect transistor die structure of claim 1, wherein the substrate semiconductor layer is not a layer of epitaxial semiconductor material.

16. A die structure comprising:
a substrate of a first conductivity type;
a first epitaxial semiconductor layer disposed on the substrate;
a second epitaxial semiconductor layer disposed on the first epitaxial semiconductor layer, wherein an upper surface of the second epitaxial semiconductor layer is an upper surface of the die structure, and wherein the first and second epitaxial semiconductor layers are the only epitaxial semiconductor layers of the die structure;
a plurality of parallel-extending buried charge compensation regions of a second conductivity type, wherein each of the parallel-extending buried charge compensation regions is disposed partly in the first epitaxial layer and is disposed partly in the second epitaxial layer but is entirely covered by semiconductor material of the first conductivity type of the second epitaxial semiconductor layer, wherein each of the parallel-extending buried charge compensation regions has an end, and wherein one of the buried charge compensation regions extends in a first straight line;
an inner buried charge compensation region of the second conductivity type, wherein the inner buried charge compensation region extends for a distance in a second straight line, wherein the second straight line is perpendicular to the first straight line, wherein the inner buried charge compensation region is disposed partly in the first epitaxial layer and is disposed partly in the second epitaxial layer but is entirely covered by semiconductor material of the first conductivity type of the second epitaxial semiconductor layer;
an outer buried charge compensation region of the second conductivity type, wherein the outer buried charge compensation region extends parallel to the inner buried charge compensation region such that the inner buried charge compensation region is disposed between the outer buried charge compensation region and the plurality of parallel-extending buried charge compensation regions, and wherein the outer buried charge compensation region is disposed partly in the first epitaxial layer and is disposed partly in the second epitaxial layer but is entirely covered by semiconductor material of the first conductivity type of the second epitaxial semiconductor layer;
a first surface region of the second conductivity type, wherein the first surface region is disposed at the upper surface of the die structure;
a second surface region of the second conductivity type, wherein the second surface region extends parallel to the first surface region at the upper surface of the die structure, and wherein the second surface region is floating and is stripe-shaped;
a third surface region of the second conductivity type, wherein the third surface region extends parallel to the second surface region at the upper surface of the die structure such that the second surface region is disposed between the first and third surface regions, wherein the third surface region is stripe-shaped; and
a metal bridging member that electrically couples the first and third surface regions together, wherein the metal bridging member bridges over the second surface region but is not coupled to the second surface region, and wherein the metal bridging member is disposed at least in part over the inner buried charge compensation region.

17. The die structure of claim 16, wherein the second surface region is a ring, and wherein the third surface region is a ring that surrounds the second surface region.

18. The die structure of claim 16, wherein there is no buried P type semiconductor region disposed between the inner buried charge compensation region and an end of said one of the buried charge compensation regions that extends in the first straight line.

19. The die structure of claim 16, wherein the die structure includes no transistor gate region that is disposed outside the first surface region.

20. The die structure of claim 16, wherein each buried charge compensation region of the plurality of parallel-extending buried charge compensation regions has a cross-sectional width and a cross-sectional height, wherein the cross-sectional height is greater than the cross-sectional width.

* * * * *